United States Patent [19]
Lee

[11] Patent Number: 5,903,600
[45] Date of Patent: May 11, 1999

[54] AUTOMATIC FREQUENCY CONTROL CIRCUIT FOR DIGITAL RADIO COMMUNICATION SYSTEM

[75] Inventor: Kyung-Min Lee, Seoul, Rep. of Korea

[73] Assignee: Samsung Electronics Co., Ltd., Suwon, Japan

[21] Appl. No.: 08/777,761

[22] Filed: Dec. 30, 1996

[30] Foreign Application Priority Data

Dec. 30, 1995 [KR] Rep. of Korea ...................... 95/67805

[51] Int. Cl.$^6$ .................................................. H04L 5/14
[52] U.S. Cl. ........................................................ 375/219
[58] Field of Search .................................... 375/219, 295, 375/316, 326, 344; 455/257, 86, 75

[56] References Cited

U.S. PATENT DOCUMENTS

| | | | |
|---|---|---|---|
| 4,852,086 | 7/1989 | Eastmond et al. ....................... | 375/216 |
| 5,042,082 | 8/1991 | Dahlin ........................................ | 455/67 |
| 5,335,364 | 8/1994 | Heinonen ................................... | 455/76 |

*Primary Examiner*—Tesfaldet Bocure
*Attorney, Agent, or Firm*—Robert E. Bushnell, Esq.

[57] ABSTRACT

An automatic frequency control circuit including wideband and distortion automatic frequency control circuits for a digital transmitter-receiver circuit. The distortion automatic frequency control circuit performs a compensation function for a slight frequency variation in a frequency offset range allowed by the specification of the system to which the circuit is applied. In this case, accordingly, it is possible to maintain a stable call conversation. When a signal having a frequency being beyond a frequency tolerance of the system is generated, the wideband automatic frequency control circuit operates to perform a rapid automatic frequency tracing function. That is, the wideband automatic frequency control circuit determines whether or not the automatic frequency control signal emerging from the distortion automatic frequency control circuit has a frequency included in an automatic frequency control range and outputs a new automatic frequency control signal based on the result of the determination. Accordingly, a frequency distortion phenomenon caused by a variation in frequency is effectively prevented.

19 Claims, 6 Drawing Sheets

AUTOMATIC FREQUENCY CONTROL CIRCUIT FOR DIGITAL RADIO COMMUNICATION SYSTEM

CLAIM OF PRIORITY

This application makes claims all benefits accruing under 35 U.S.C. §119 from an application for AUTOMATIC FREQUENCY CONTROL CIRCUIT FOR DIGITAL RADIO COMMUNICATION SYSTEM earlier filed in the Korean Industrial Property Office on Dec. 30, 1995 and there duly assigned Ser. No. 67805/1995.

BACKGROUND OF THE INVENTION

1. Field of the Invention

The present invention relates to an automatic frequency control circuit for a digital transmitter-receiver unit in a digital communication system, and more particularly to an automatic frequency control circuit capable of inhibiting a distortion phenomenon caused by a variation in frequency involved in a time division duplex (TDD) communication system.

2. Description of the Prior Art

The presently available digital cordless telephone systems adopt, as a transfer technique, a TTD system or time division multiple access (TDMA)-TDD system in which signal transmitting and receiving operations are carried out in a ping-pong manner using a single frequency.

FIG. 1 is a block diagram illustrating a digital transmitter-receiver circuit which adopts a conventional continuous automatic frequency control method. Such a transmitter-receiver circuit is disclosed in U.S. Pat. No. 5,309,429 invented by Kuno Fukuda, assigned to Sony Corporation and issued on May 3, 1994. This transmitter-receiver circuit includes an automatic frequency control circuit which serves to control a local oscillator included in the receiver part of the transmitter-receiver circuit. When an input signal exhibiting a high frequency offset is received at the receiver part of the transmitter-receiver circuit, the automatic frequency control circuit feeds back a voltage signal corresponding to the frequency offset, thereby varying the frequency of an output signal from the local oscillator. The automatic frequency control circuit includes a frequency discriminator 72 and a lowpass filter 73. An output signal from the frequency discriminator 72 is accumulated as a reference voltage in a memory internally included in the lowpass filter 73. Based on the reference voltage, the automatic frequency control circuit controls the frequency of a carrier signal Si sent to a modulator 84 included in the transmitter part of the transmitter-receiver circuit and the frequency of a signal Sj sent to the local oscillator of the receiver part. In this way, the automatic frequency control circuit carries out an automatic frequency control function.

FIG. 2 is a circuit diagram illustrating a detailed configuration of a part of the digital transmitter-receiver circuit shown in FIG. 1. Since a frequency drift may occur while the transmitter-receiver circuit receives incoming calls, the automatic frequency control circuit included in the transmitter-receiver circuit performs an automatic frequency control for each incoming call.

In a transmitting interval, a switch 733 of the low-pass filter 73 is switched on by a control signal $S_{37}$ output from a system control unit 31. Accordingly, the output voltage $V_{72}$ of the frequency discriminator 72 becomes smooth through capacitors 732 and 734. As a result, the output voltage of the frequency discriminator 72 is averaged and then accumulated in the system control unit 31 as a reference voltage.

In a receiving interval, the same automatic frequency control operation, as in the transmitting interval, is carried out. That is, the switch 733 of the low-pass filter 73 is switched on by the control signal $S_{37}$ output from the system control unit 31 in the transmitting interval. Accordingly, the output voltage $V_{72}$ of the frequency discriminator 72 becomes smooth through the capacitors 732 and 734. As a result, the output voltage of the frequency discriminator 72 is averaged and then transmitted to the system control unit 31.

Then, the system control unit 31 compares the output from the low-pass filter 73 received therein in the receiving interval with the reference voltage accumulated in the transmitting interval, thereby detecting a difference between the compared voltages. Based on the voltage difference, the system control unit 31 adjusts the oscillating frequency of the voltage-controlling local oscillator in such a manner that the voltage difference becomes zero.

However, the above-mentioned conventional automatic frequency control system may have the following problems where it is applied to a frequency division multiple access-time division duplex (FDMA-TDD) communication system.

First, the FDMA-TDD communication system carries out transmitting and receiving operations at different time intervals, respectively. Although the local oscillator generates a normal frequency having no frequency deviation ($\Delta f=0$) from a central frequency in a transmitting interval of the communication system, a variation in frequency may occur within a tolerance from the central frequency (namely, a 50% range from ±10 KHz defined in accordance with the CT-2 CAI Standard) in a receiving interval of the communication system. In this case, the communication system performs an automatic frequency control, thereby tracing the output signal from a demodulation unit in the form shown in FIG. 3. In FIG. 3, the phantom line indicates an ideal reference signal which is constant in amplitude depending on time. However, a variation in amplitude occurs in a practical case, as shown by the solid line of FIG. 3. In the receiver circuit of a digital cordless telephone, it is essentially necessary to generate a reference signal for shaping the digital waveform of digital data radio-received in the receiver circuit in the form of a signal suited for a base-band signal processing unit upon recovering the digital data. As a result, the reference signal may vary continuously in amplitude due to a continuous small variation in the received frequency. In this case, a frequency distortion may occur. Furthermore, a degradation in signal to noise (S/N) ratio also occurs. As a result, the sensitivity of the practical system to incoming data may be degraded.

Second, where the conventional continuous automatic frequency circuit is applied to the signaling hierarchy of a second generation digital cordless telephone (CT-2), it is difficult to appropriately carry out a frequency control for each signaling layer. For this reason, it is impossible to achieve an efficient automatic frequency control. This results in a degradation in the performance of the whole system. Of course, it is possible to satisfy the demand of each signaling layer using the continuous automatic frequency circuit. In this case, however, the configuration of the circuit is considerably complicated.

SUMMARY OF THE INVENTION

Therefore, an object of the invention is to provide an automatic frequency control circuit for a digital radio communication system which is capable of preventing a variation in the amplitude of a reference signal even when a slight variation in the frequency of an input signal occurs continuously, so that a frequency distortion phenomenon is avoided, thereby maintaining an improved sensitivity to incoming data.

Another object of the invention is to provide an automatic frequency control circuit for a digital radio communication system which is capable of achieving an efficient automatic frequency control for each signaling layer of a second generation digital cordless telephone.

In order to accomplish these objects, the present invention provides an automatic frequency control circuit which sets a frequency band having a limited tolerance for a slight variation in the frequency of an input signal so that a traced signal level in association with the slight frequency variation can be constant. Accordingly, a frequency distortion phenomenon caused by a variation in frequency is effectively prevented.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

The present invention provides wideband and distortion automatic frequency control circuits for a digital transmitter-receiver circuit. The distortion automatic frequency control circuit performs a compensation function for a slight frequency variation in a frequency offset range allowed by the specification of the system to which the circuit is applied. In this case, accordingly, it is possible to maintain a stable call conversation. When a signal having a frequency being beyond a frequency tolerance of the system is generated, the wideband automatic frequency control circuit operates to perform a rapid automatic frequency tracing function.

Figure 4:
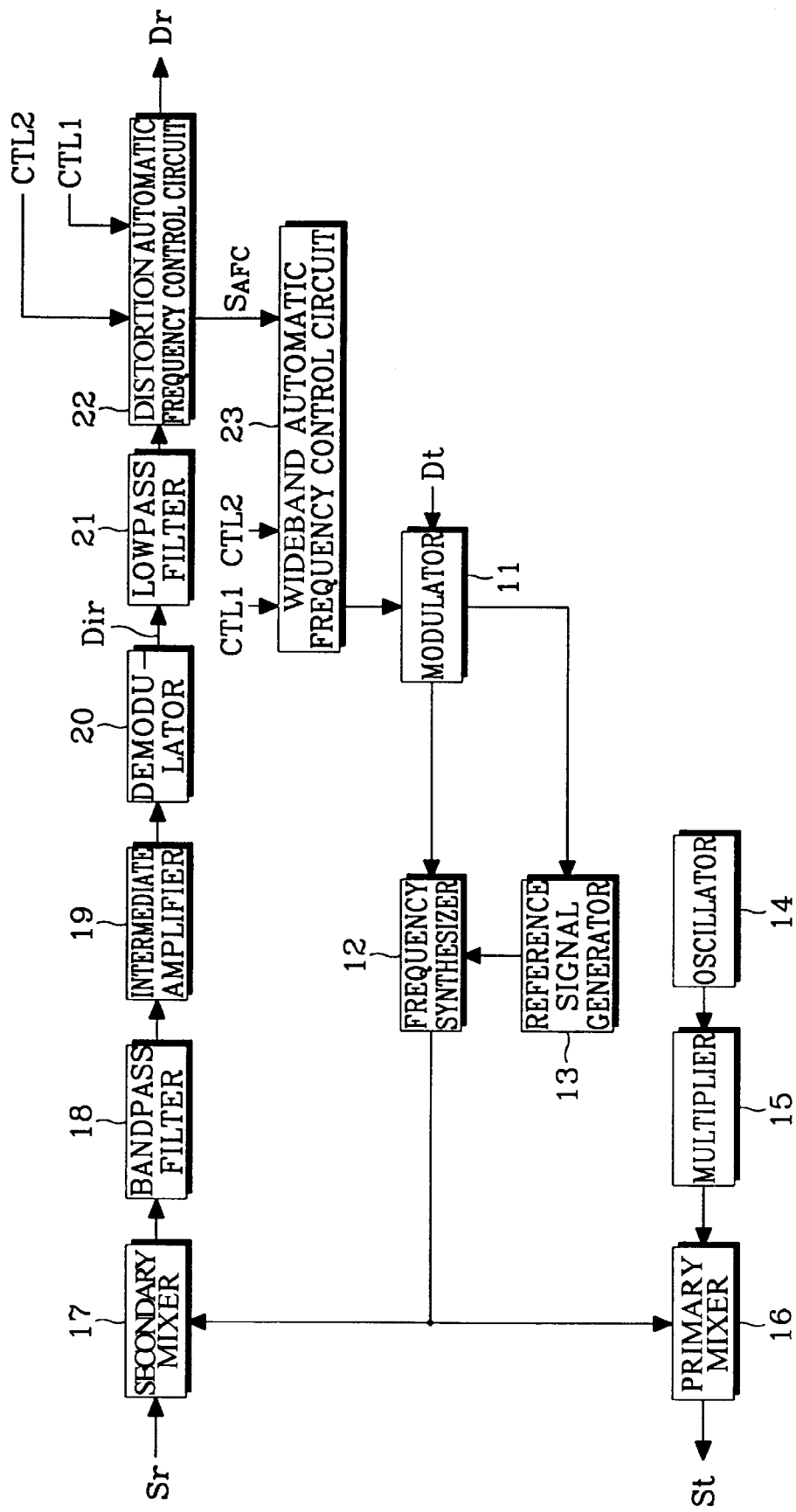
FIG. 4 is a block diagram illustrating a digital transmitter-receiver circuit according to an embodiment of the present invention.

FIG. 4 is a block diagram illustrating a digital transmitter-receiver circuit according to an embodiment of the present invention. The digital transmitter-receiver circuit has a configuration capable of achieving an automatic frequency control for a broad band or narrow band in accordance with a given signal protocol. An input signal Dt from a speaker (not shown) is received at a modulator 11 which serves to modulate the input signal in the form of transmitting data. The modulated signal from the modulator 11 is sent to a frequency synthesizer 12 and a reference signal generator 13. The reference signal generator 13 generates a reference signal of 16.2 MHz based on the modulated signal and then sends the reference signal to the frequency synthesizer 12. The frequency synthesizer 12 synthesizes the reference signal from the reference signal generator 13 with the modulated signal, thereby generating a locally oscillating signal. This locally oscillating signal is then sent to primary and secondary mixers 16 and 17, respectively.

On one hand, the primary mixer 16 also receives a transmitting reference signal which is obtained by triplicating a signal from an oscillator 14 by a triplex multiplier 15. The oscillator 14 is a transmitting offset oscillator which generates a signal of 50.0 MHz. The primary mixer 16 synthesizes the transmitting reference signal with the locally oscillating signal, thereby outputting a transmitting carrier signal St.

On the other hand, the locally oscillating signal output from the frequency synthesizer 12 is also mixed with an incoming signal Sr in a secondary mixer 17 which, in turn, generates an intermediate frequency signal. This intermediate frequency signal is sent to a bandpass filter 18 and then amplified in an intermediate amplifier 19. The amplified signal is sent to a demodulator 20 which, in turn, carries out a signal detection in accordance with a frequency discriminating method. The detected signal is sent to a distortion automatic frequency control circuit 22 via a lowpass filter 21.

The distortion automatic frequency control circuit 22 compensates a small variation in the frequency received in the circuit as mentioned above. On the other hand, a large variation in frequency is compensated for by a wideband automatic frequency control circuit 23. This compensation is achieved by varying the reference voltage of a comparator internally included in the wideband automatic frequency control circuit 23. When the signal received in the wideband automatic frequency control circuit 23 is higher than the varied reference voltage, the wideband automatic frequency control circuit 23 operates to vary an input value at the modulator 11. Accordingly, the frequency synthesizer 12 varies in frequency.

Figure 5:
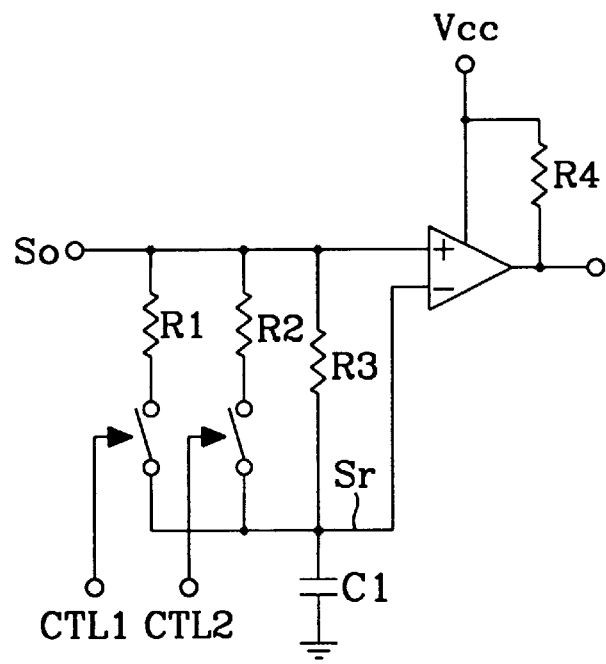
FIG. 5 is a circuit diagram illustrating a switching operation for a distortion automatic frequency control carried out in the circuit of FIG. 4 in accordance with the present invention.

FIG. 5 is a circuit diagram illustrating a switching operation for a distortion automatic frequency control carried out in the circuit 22 of FIG. 4 in accordance with the present invention. In FIG. 5, the reference character So denotes an output signal from the demodulator 20 whereas the reference character Sr is a bit-discriminating reference signal detected from the output signal from the demodulator 20. The reference character CTL2 is a control signal for controlling a first signaling layer which mainly consists of three signals MUX1, MUX2 and MUX3. The signals MUX2 and MUX3 each include a synchronization signal and a D-channel corresponding to a signaling channel. The signal MUX1 includes a speech signal and a B-channel corresponding to a data channel. The signals MUX2 and MUX3 have a signal pattern which is not random, but has a continuous waveform of same codes. On the other hand, the signal MUX1 has a relatively random signal pattern. Accordingly, the signaling layer, which is controlled by the control signal CTL2, is different from the signaling layer which is controlled by a control signal CTL1. In other words, the data pattern in a state, in which the signal MUX2 is converted into the signal MUX1 in accordance with whether or not a synchronization word is recognized from the signal MUX2, is different from the data pattern in a state in which the signal MUX3 is converted into the signal MUX2 in accordance with whether or not a channel marker bit pattern is recognized from the signal MUX3.

The number of digital signals exhibiting a high level and the number of digital signals exhibiting a low level may vary in accordance with signaling layers. The digital signal output from the demodulator of a practical receiver circuit has a mean value usually corresponding to an intermediate value between the high and low levels through resistors R1 to R3 and a capacitor C1 which are shown in FIG. 5. It is possible to compensate an undesirable variation in the amplitude of the detected output depending on a variation in frequency occurring in the frequency detection method by an associated variation in the amplitude of the reference signal detected by the resistors R1 to R3 and capacitor C1. Accordingly, frequency errors caused by a variation in incoming frequency occurring in a local area can be reduced. Furthermore, no feedback path is required. Accordingly, a rapid automatic frequency control function can be carried out. The signal $S_{AFC}$ transmitted from the distortion automatic frequency control circuit 22 corresponds to an automatic frequency control signal.

However, where an incoming signal exhibits a variation in frequency beyond a tolerance allowed by the distortion automatic frequency control circuit 22, an automatic frequency tracing function is carried out by the wideband automatic frequency control circuit 23. In this case, the oscillating frequency of the local oscillator also varies in such a manner that the incoming signal has a frequency being within a tolerance. When the incoming signal has a frequency being within a tolerance, the automatic frequency tracing is stopped. Accordingly, it is possible to prevent a frequency distortion phenomenon.

Figure 6:
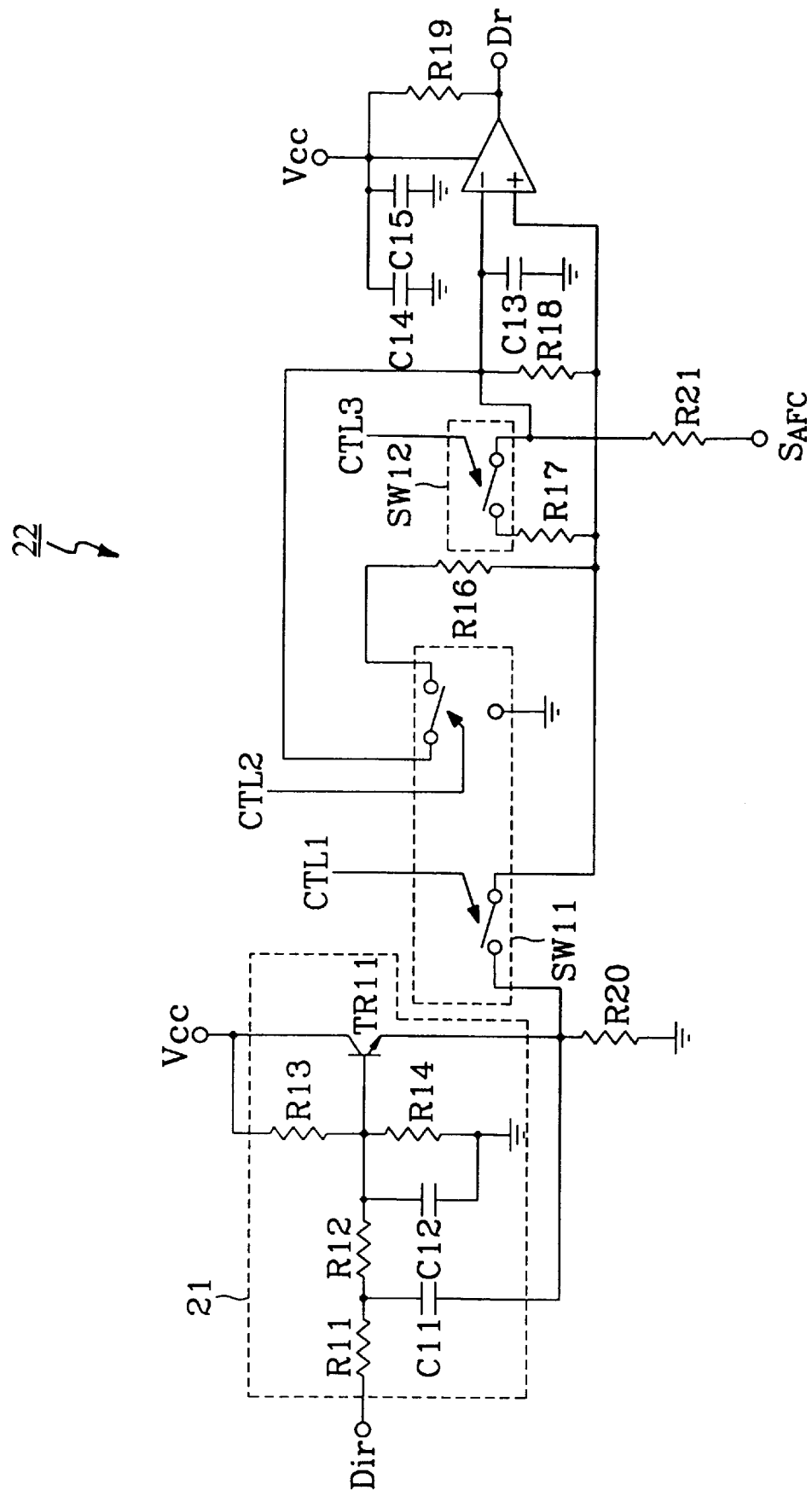
FIG. 6 is a circuit diagram of the distortion automatic frequency control circuit.

FIG. 6 is a circuit diagram of the distortion automatic frequency control circuit 22 shown in FIG. 4. FIG. 6 shows connections of the distortion automatic frequency control circuit 22 to peripheral signal input and output stages. In FIG. 6, the reference numeral 21 indicates the lowpass filter 21 which receives an audio signal output from the demodulator 20 of the receiver circuit. The lowpass filter 21 includes a transistor TR11, resistors R11, R12, R13 and R14, and capacitors C11 and C12. The distortion automatic frequency control circuit 22 includes switches SW11 and SW12, resistors R16, R17 and R18, and a capacitor C13. These elements serve to control a reference signal detecting characteristic in accordance with a given signal protocol. The TR11 serves to bit-slice the digital audio signal received from the modulator 20.

Figure 7:
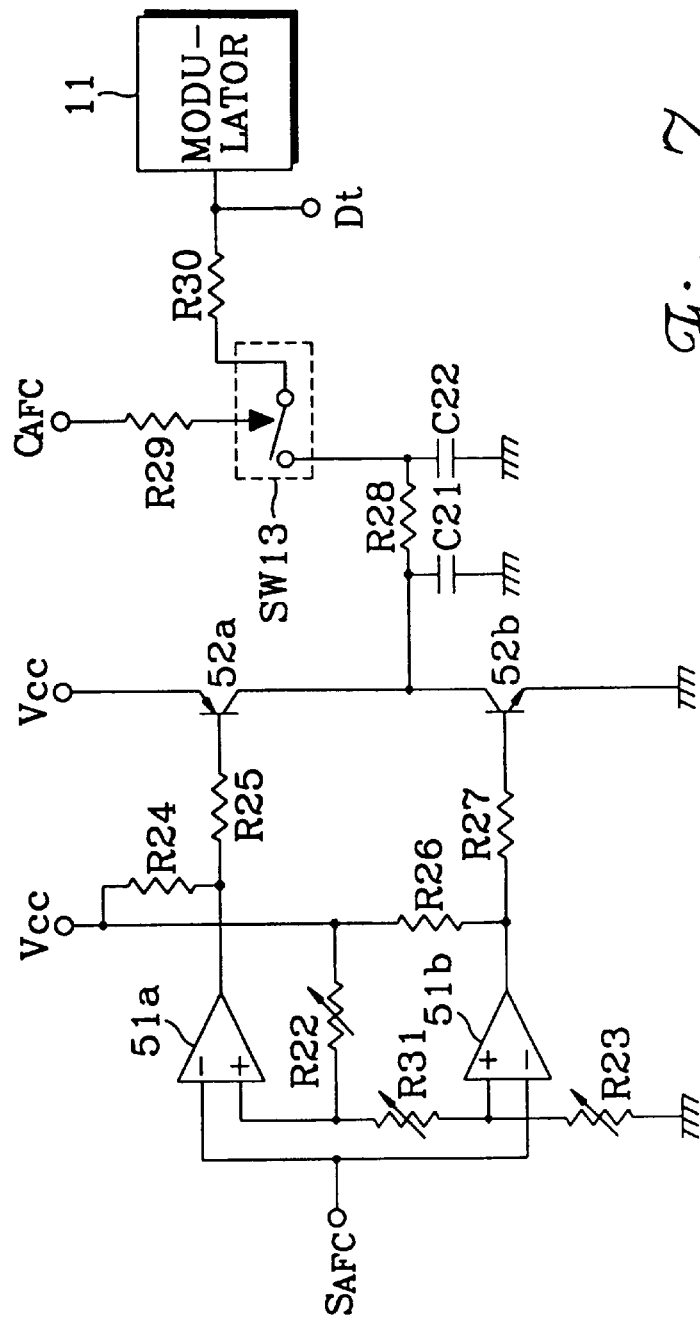
FIG. 7 is a circuit diagram of a wideband automatic frequency control circuit included in the circuit of FIG. 4.

FIG. 7 is a circuit diagram of the wideband automatic frequency control circuit 23 shown in FIG. 4. In FIG. 7, the reference character $C_{AFC}$ is a signal for controlling the automatic frequency control function. The control signal $C_{AFC}$ is sent from the signal processor on the baseband board of a second a generation cordless telephone.

Figure 1:
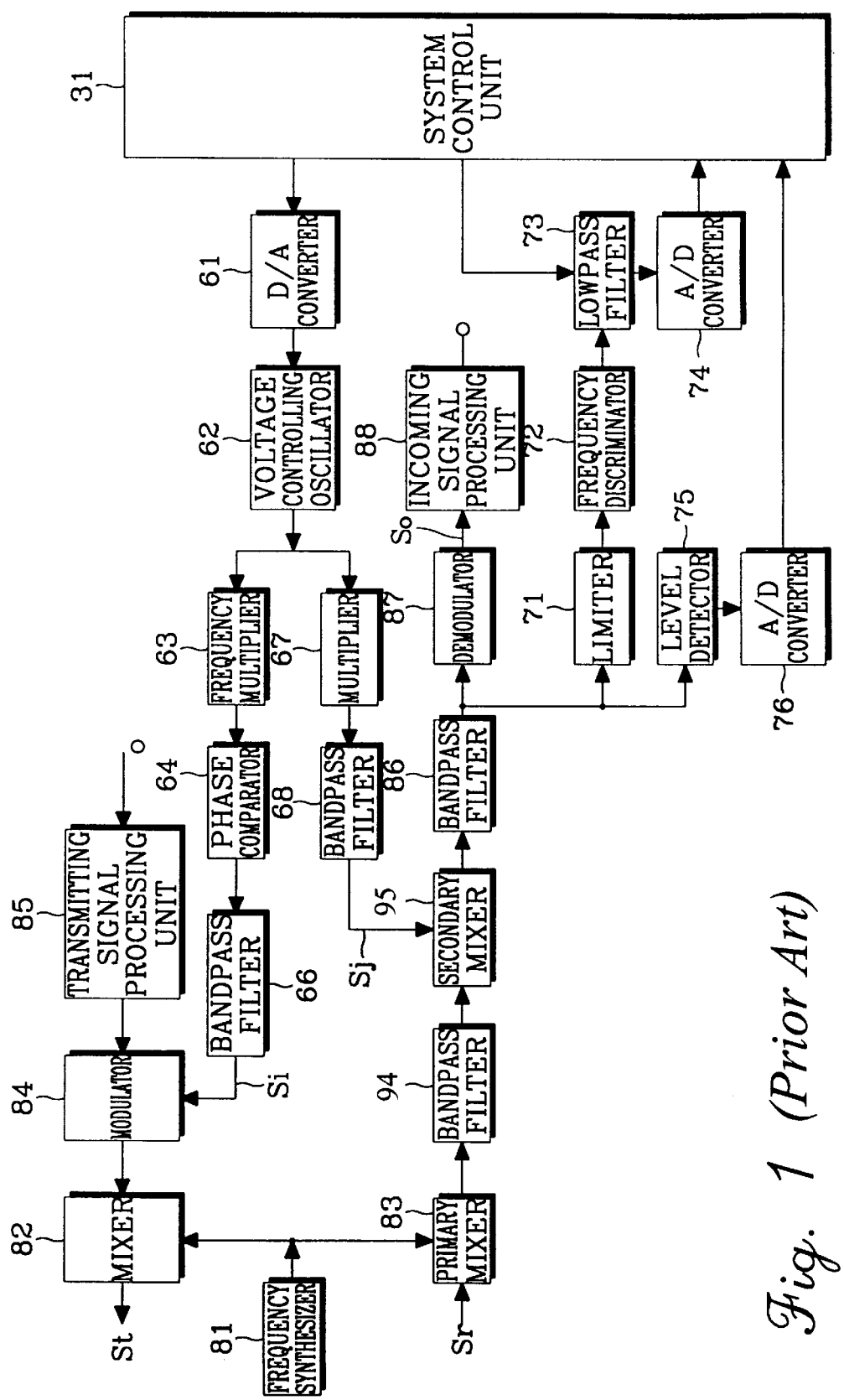
FIG. 1 is a block diagram illustrating a digital transmitter-receiver circuit which adopts a conventional continuous automatic frequency control method.
Figure 2:
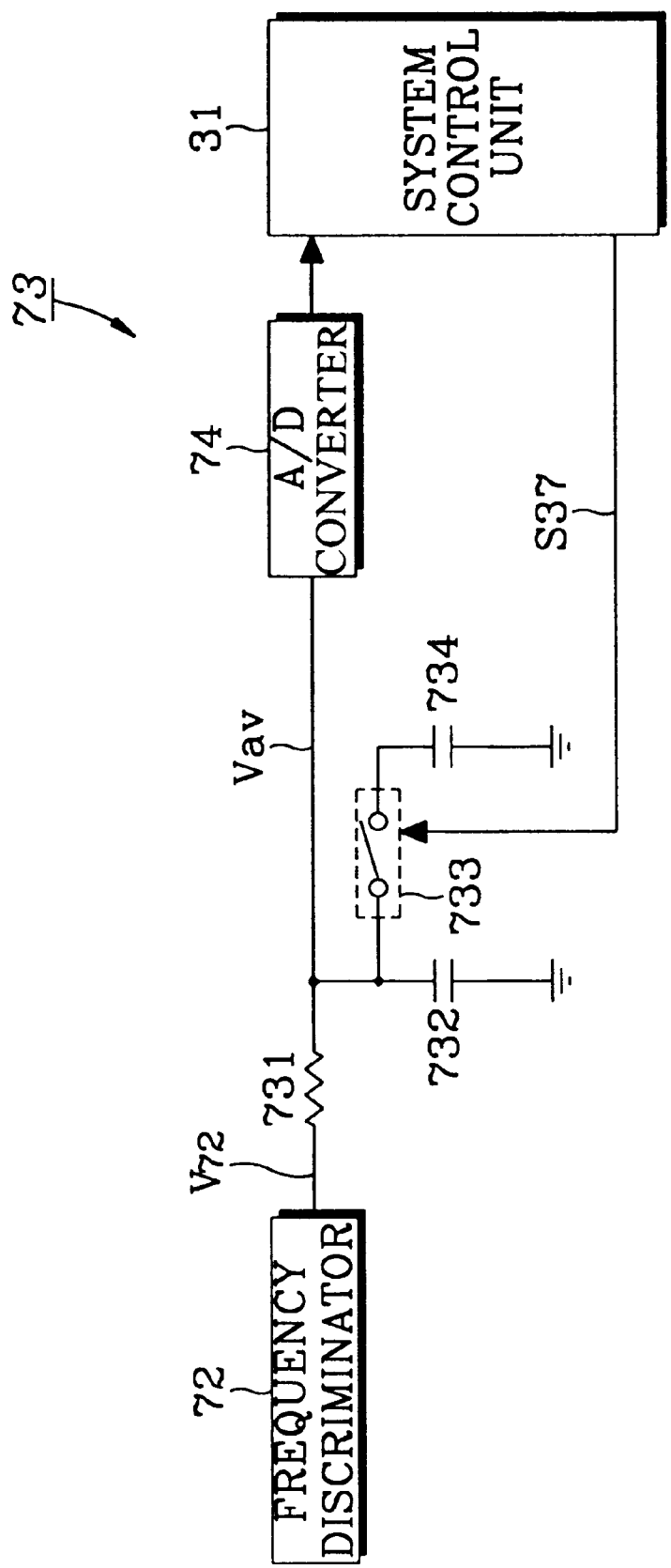
FIG. 2 is a circuit diagram illustrating a detailed configuration of a part of the digital transmitter-receiver circuit shown in FIG. 1.
Figure 3:
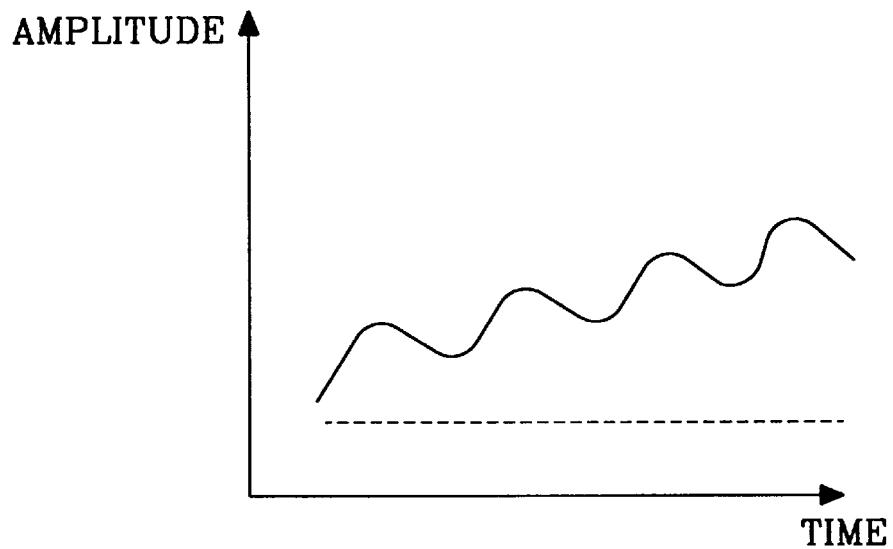
FIG. 3 is a graph depicting a variation in the amplitude of a reference signal in a shaping circuit depending on a variation in the frequency of an input signal.

The control signal $C_{AFC}$ has different logic states in a free scanning mode and in a transmitting or receiving mode, respectively. In the free scanning mode, the generation rates of "1" and "0" are equal because random data is generated. In this case, decision reference data is positioned at the center of the waveform of demodulated data. Accordingly, it is unnecessary to provide a wideband automatic frequency control function by virtue of a low bit rate. Where the automatic frequency control function is continuously carried out as in FIG. 1, a sharp variation in frequency may occur in the free scanning mode. As a result, when a mode change is carried out, a frequency distortion loss may occur, rather than a frequency compensation effect. For this reason, the control signal $C_{AFC}$ is maintained in a logic state of "1" (high) in the free scanning mode so as to exclude an unconditional automatic frequency control function in a situation in which the control function is unnecessary. Accordingly, it is possible to prevent a frequency distortion.

When a transmitting or receiving operation is carried out after the completion of the free scanning mode, the logic state of the control signal $C_{AFC}$ is changed from "1" to "0" so as to execute a wideband automatic frequency control operation.

As shown in FIG. 7, the wideband automatic frequency control circuit includes comparators 51a and 51b each adapted to compare an automatic frequency control signal $S_{AFC}$ received at its inverting input with a predetermined reference voltage received at its non-inverting input, thereby determining whether or not the signal $S_{AFC}$ is in a range in which the automatic frequency control function is applicable. This range is determined by the reference voltage received at the non-inverting input. The wideband automatic frequency control circuit 23 also includes transistors 52a and 52b, capacitors C21 and C22, and a resistor R28 in order to determine the current amount and bandwidth of the automatic frequency control signal $S_{AFC}$ which is sent to a switch SW13 via the comparators 51a and 51b.

In other words, the variation in voltage detected by the distortion automatic frequency control circuit 22 shown in FIG. 6 is input at the wideband automatic frequency control circuit 23 shown in FIG. 7. The reference voltages of the comparators 51a and 51b are set to a value which is in the maximum tolerance of an incoming signal. Accordingly, when the frequency of the incoming signal is higher than the tolerance from the central frequency, the output of the comparator 51a is in a low state. In this state, the transistor 52a turns on, thereby causing the modulator 11 to increase the output frequency of the local oscillator. As a result, the incoming signal decreases in frequency. On the other hand, when the frequency of the incoming signal is lower than the tolerance from the central frequency, the output of the comparator 51b is in a high state, thereby causing the transistor 52b to turn on. In this state, the modulator 11 serves to decrease the output frequency of the local oscillator. As a result, the incoming signal increases in frequency.

In this way, the oscillating frequency of the local oscillator varies so that the frequency of the incoming signal can be within the given frequency tolerance. When the frequency of the incoming signal is within the given frequency tolerance, the automatic frequency tracing is stopped. Accordingly, it is possible to prevent a frequency distortion phenomenon. According to the above, the oscillating frequency of the local oscillator varies so that the frequency of the incoming signal can be within the given frequency tolerance. When the frequency of the incoming signal is within the given frequency tolerance, the automatic frequency tracing is stopped. Accordingly, it is possible to prevent a frequency distortion phenomenon.

Where both the wideband automatic frequency control circuit 23 and the distortion automatic frequency control circuit 22 are employed, it is possible not only to solve the problems involved in the prior art, but also to effectively carry out a control function depending on a mode change. The automatic frequency control function can also be carried out only in a required time interval. Accordingly, it is possible to finely control the degree of frequency compensation depending on the data pattern which varies in accordance with each signaling layer. This results in an improvement in the stability and reliability of the system.

As apparent from the above description, the present invention provides an automatic frequency control circuit which is capable of maintaining a very stable carrier frequency in spite of the limited error compensation performance of a frequency oscillator. Even when an unexpected large frequency drift occurs in the receiving mode, the automatic frequency control circuit can achieve a rapid frequency stabilization by its wideband automatic frequency control function. A small frequency drift can be compensated for by a distortion automatic frequency control function of the automatic frequency control circuit. Accordingly, it is possible to minimize the possibility of other errors generated during the whole operation of the system. In addition, it is unnecessary to use expensive highly-stable oscillators for a practical frequency stabilization. Accordingly, there is an advantage in that the cost can be reduced.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An automatic frequency control circuit for a digital radio communication system comprising:

a modulator adapted to receive transmitting data and to modulate the transmitting data under a desired control;

a reference signal generator adapted to generate a reference signal having a desired frequency based on the modulated signal;

a frequency synthesizer adapted to synthesize the modulated signal with the reference signal, thereby outputting a locally oscillating signal;

a transmitting reference signal generating unit adapted to generate a transmitting reference signal;

a primary mixer adapted to synthesize the transmitting reference signal with the locally oscillating signal, thereby outputting a transmitting carrier signal;

a secondary mixer adapted to synthesize an incoming signal received at the system with the locally oscillating signal, thereby converting the incoming signal into an intermediate frequency signal;

a bandpass filter adapted to detect a predetermined band of the intermediate frequency signal;

an intermediate amplifier adapted to amplify the signal emerging from the bandpass filter to a desired level;

a demodulator adapted to detect the amplified signal in accordance with a frequency discrimination method;

a lowpass filter adapted to detect a lowband component of the detected signal; and a distortion automatic frequency control circuit for generating said lowband component as an automatic frequency control signal in response to a given adjusted signal provided from the exterior, bit-standardizing said lowband component to generate a bit-shaped component, and transmitting said bit-shaped component to said modulator.

2. The automatic frequency control circuit in accordance with claim 1, further comprising:

a wideband automatic frequency control circuit arranged between the distortion automatic frequency control circuit and the modulator and adapted to determine whether or not the automatic frequency control signal emerging from the distortion automatic frequency control circuit has a frequency included in an automatic frequency control range and to output a new automatic frequency control signal based on the result of the determination.

3. The automatic frequency control circuit in accordance with claim 1, wherein the transmitting reference signal generating unit comprises:

an oscillator adapted to generate a signal having a predetermined frequency; and a multiplier adapted to triplicate the signal generated from the oscillator, thereby generating said transmitting reference signal.

4. The automatic frequency control circuit in accordance with claim 2, wherein the wideband automatic frequency control circuit comprises:

a pair of comparators each adapted to compare the automatic frequency control signal applied to an inverting input thereof with a reference voltage applied to a non-inverting input thereof, thereby determining whether or not the automatic frequency control signal has a frequency included in a frequency range in which an automatic frequency control function is applicable;

a switch being switched on and off in response to a control signal externally applied to control an automatic frequency control function, the switch being adapted to transmit the automatic frequency control signal to the modulator; and means arranged between each output of the comparators and the switch and adapted to determine the current amount and bandwidth of the automatic frequency control signal transmitted to the switch.

5. The automatic frequency control circuit of claim 4, wherein said distortion automatic frequency control circuit detects a variation in voltage and then transmits said variation in voltage to said wideband automatic frequency control circuit.

6. The automatic frequency control circuit in accordance with claim 2, wherein the transmitting reference signal generating unit comprises:

an oscillator adapted to generate a signal having a predetermined frequency; and a multiplier adapted to triplicate the signal generated from the oscillator, thereby generating said transmitting reference signal.

7. The automatic frequency control circuit of claim 5, wherein said wideband automatic frequency control circuit controls said modulator to increase a frequency of said locally oscillating signal when said variation in voltage is higher than a maximum tolerance of said incoming signal.

8. The automatic frequency control circuit of claim 7, wherein a frequency of said incoming signal is decreased when said modulator increases said frequency of said locally oscillating signal.

9. The automatic frequency control circuit of claim 5, wherein said wideband automatic frequency control circuit controls said modulator to decrease a frequency of said locally oscillating signal when said variation in voltage is lower than a maximum tolerance of said incoming signal.

10. The automatic frequency control circuit of claim 9, wherein a frequency of said incoming signal is increased when said modulator decreases said frequency of said locally oscillating signal.

11. An automatic frequency control apparatus, comprising:
- a modulator adapted to receive transmitting data and to modulate the transmitting data under a desired control;
- a reference signal generator adapted to generate a reference signal having a desired frequency based on the modulated signal;
- a frequency synthesizer adapted to synthesize the modulated signal with the reference signal, thereby outputting a locally oscillating signal;
- a transmitting reference signal generating unit adapted to generate a transmitting reference signal;
- a primary mixer adapted to synthesize the transmitting reference signal with the locally oscillating signal, thereby outputting a transmitting carrier signal;
- a secondary mixer adapted to synthesize an incoming signal received at the system with the locally oscillating signal, thereby converting the incoming signal into an intermediate frequency signal; and
- a distortion automatic frequency control circuit receiving a lowband signal corresponding to said intermediate frequency signal, generating an automatic frequency control signal in response to a given adjusted signal provided from an external unit and in response to said lowband signal, bit-standardizing said lowband signal to generate a bit-shaped component, and transmitting said bit-shaped component to said modulator.

12. The automatic frequency control apparatus of claim 11, further comprising a bandpass filter adapted to detect a predetermined band of the intermediate frequency signal.

13. The automatic frequency control apparatus of claim 12, further comprising an intermediate amplifier adapted to amplify the signal emerging from the bandpass filter to a desired level.

14. The automatic frequency control apparatus of claim 13, further comprising a demodulator adapted to detect the amplified signal in accordance with a frequency discrimination method.

15. The automatic frequency control apparatus of claim 14, further comprising a lowpass filter detecting a lowband component of the detected signal, said lowpass filter transmitting said lowband signal to said distortion automatic frequency control circuit, said lowband signal corresponding to said lowband component.

16. An automatic frequency control apparatus, comprising:
- a modulator adapted to receive transmitting data and to modulate the transmitting data under a desired control;
- a reference signal generator adapted to generate a reference signal having a desired frequency based on the modulated signal;
- a frequency synthesizer adapted to synthesize the modulated signal with the reference signal, thereby outputting a locally oscillating signal;
- a transmitting reference signal generating unit adapted to generate a transmitting reference signal;
- a primary mixer adapted to synthesize the transmitting reference signal with the locally oscillating signal, thereby outputting a transmitting carrier signal;
- a secondary mixer adapted to synthesize an incoming signal received at the system with the locally oscillating signal, thereby converting the incoming signal into an intermediate frequency signal;
- a distortion automatic frequency control circuit receiving a lowband signal corresponding to said intermediate frequency signal, generating an automatic frequency control signal in response to a given adjusted signal provided from an external unit and in response to said lowband signal, bit-standardizing said lowband signal to generate a bit-shaped component, and transmitting said bit-shaped component to said modulator; and
- a wideband automatic frequency control circuit arranged between the distortion automatic frequency control circuit and the modulator and adapted to determine whether or not the automatic frequency control signal emerging from the distortion automatic frequency control circuit has a frequency included in an automatic frequency control range and to output a new automatic frequency control signal based on the result of the determination.

17. The automatic frequency control apparatus of claim 16, wherein the transmitting reference signal generating unit further comprises:
- an oscillator adapted to generate a signal having a predetermined frequency; and
- a multiplier adapted to triplicate the signal generated from the oscillator, thereby generating said transmitting reference signal.

18. The automatic frequency control apparatus of claim 16, wherein the wideband automatic frequency control circuit further comprises:
- a pair of comparators each adapted to compare the automatic frequency control signal applied to an inverting input thereof with a reference voltage applied to a non-inverting input thereof, thereby determining whether or not the automatic frequency control signal has a frequency included in a frequency range in which an automatic frequency control function is applicable;
- a switch being switched on and off in response to a control signal externally applied to control an automatic frequency control function, the switch being adapted to transmit the automatic frequency control signal to the modulator; and
- means arranged between each output of the comparators and the switch and adapted to determine the current amount and bandwidth of the automatic frequency control signal transmitted to the switch.

19. The automatic frequency control apparatus of claim 16, further comprising:
- a primary mixer adapted to synthesize the transmitting reference signal with the locally oscillating signal, thereby outputting a transmitting carrier signal;
- a primary mixer adapted to synthesize the transmitting reference signal with the locally oscillating signal, thereby outputting a transmitting carrier signal;
- a bandpass filter adapted to detect a predetermined band of the intermediate frequency signal;
- an intermediate amplifier adapted to amplify the signal emerging from the bandpass filter to a desired level;
- a demodulator adapted to detect the amplified signal in accordance with a frequency discrimination method; and
- a lowpass filter detecting a lowband component of the detected signal, said lowpass filter transmitting said lowband signal to said distortion automatic frequency control circuit, said lowband signal corresponding to said lowband component.

* * * * *